United States Patent
Kim

(10) Patent No.: US 9,224,445 B2
(45) Date of Patent: Dec. 29, 2015

(54) SEMICONDUCTOR MEMORY APPARATUS WITH MAIN MEMORY BLOCKS AND REDUNDANT MEMORY BLOCKS SHARING A COMMON GLOBAL DATA LINE

(75) Inventor: Min Su Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 300 days.

(21) Appl. No.: 13/604,240

(22) Filed: Sep. 5, 2012

(65) Prior Publication Data

US 2013/0201767 A1 Aug. 8, 2013

(30) Foreign Application Priority Data

Feb. 6, 2012 (KR) .................. 10-2012-0011814

(51) Int. Cl.
*G11C 29/00* (2006.01)
*G11C 8/00* (2006.01)
*G11C 7/10* (2006.01)

(52) U.S. Cl.
CPC *G11C 8/00* (2013.01); *G11C 29/76* (2013.01); *G11C 7/1069* (2013.01)

(58) Field of Classification Search
CPC .... G11C 29/76; G11C 29/787; G11C 29/789; G11C 29/808

USPC .................. 365/230.03, 200, 189.05, 225.7, 365/185.09, 185.11
See application file for complete search history.

(56) References Cited

U.S. PATENT DOCUMENTS

| 5,392,246 A * | 2/1995 | Akiyama et al. ............... 365/200 |
| 8,576,638 B2 * | 11/2013 | Kim et al. ................ 365/189.05 |
| 2006/0044897 A1 * | 3/2006 | Maki ............................. 365/200 |

FOREIGN PATENT DOCUMENTS

| KR | 10-2002-0069731 A | 9/2002 |
| KR | 10-2004-0023856 A | 3/2004 |
| KR | 10-2006-0117394 A | 11/2006 |

* cited by examiner

*Primary Examiner* — Andrew Q Tran
(74) *Attorney, Agent, or Firm* — William Park & Associates Ltd.

(57) ABSTRACT

A semiconductor memory apparatus includes: a memory area including a plurality of memory banks having main memory areas configured to transmit and receive data to and from the outside through a plurality of global data lines, respectively, and one or more redundancy memory areas configured to use any one of the global data lines as a common global data line; and a controller configured to control data to be transmitted and received through the common global data line, as a redundancy program mode, a redundancy read mode, or a redundancy erase mode is enabled.

4 Claims, 12 Drawing Sheets

SEMICONDUCTOR MEMORY APPARATUS WITH MAIN MEMORY BLOCKS AND REDUNDANT MEMORY BLOCKS SHARING A COMMON GLOBAL DATA LINE

CROSS-REFERENCES TO RELATED APPLICATION

The present application claims priority under 35 U.S.C. §119(a) to Korean application number 10-2012-0011814, filed on Feb. 6, 2012, in the Korean Intellectual Property Office, which is incorporated herein by reference in its entirety.

BACKGROUND

1. Technical Field

The present invention relates generally to an integrated circuit, and more particularly to a semiconductor memory apparatus, an operating method thereof, and a data processing system using the same.

2. Related Art

A memory apparatus includes a redundancy cell for replacing a failed main memory cell in order to secure the yield. Furthermore, after the failed main memory cell is replaced with the redundancy cell through a repair operation, the memory apparatus stores the address of the redundancy cell so as to change the address of the repaired main memory cell into that of the redundancy cell. The method for storing a repair address has developed from a method using a fuse to a method using a code addressable memory (CAM).

FIG. 1 is a configuration diagram of a known semiconductor memory apparatus.

Referring to FIG. 1, the known memory apparatus 10 includes a memory area 110, a page buffer circuit 120, an input/output control circuit 130, a peripheral circuit 140, and a controller 150.

The memory area 110 may include a plurality of planes, and each of the planes may include a plurality of banks BANK0 and BANK1. Furthermore, the plane may include redundancy memory areas RED0 and RED1 for replacing a failed main memory cell included in the banks BANK0 and BANK1, when a failure occur in the main memory cell. In general, the redundancy memory cells RED0 and RED1 are provided to correspond to the respective banks BANK0 and BANK1.

The page buffer circuit 120 may include main page buffers PB0 and PB1 and redundancy page buffers RPB0 and RPB1. The main page buffers PB0 and PB1 are configured to transmit and receive data to and from main memory cells inside the banks BANK0 and BANK1, and the redundancy page buffers RPB0 and RPB1 are configured to transmit and receive data to and from redundancy memory cells inside the redundancy memory areas RED0 and RED1.

The input/output control circuit 130 is configured to output data latched in the page buffer circuit 120 to the outside through a global data line GDL or receive data provided from outside through the global data line GDL and provide the received data to the page buffer circuit 120.

The peripheral circuit 140 includes circuits configured to program data into the memory area 110 or read data stored in the memory area 110. For example, the circuits may include an address decoder, a voltage supply circuit and the like.

The controller 150 is configured to control the memory area 110, the page buffer circuit 120, the input/output control circuit 130, and the peripheral circuit 140. In particular, the controller 150 outputs a control signal for selecting a page buffer forming the page buffer circuit 120 according to whether an address provided to access the memory area 110 during a program/read/erase operation is a repair address or not.

Referring to FIG. 1, it can be seen that one bank BANK and one main page buffer PB are coupled to each other through a bit line, and one redundancy memory area RED and one redundancy page buffer RPB are coupled to each other through a bit line. That is, the known semiconductor memory apparatus allocates a redundancy memory area to each bank, and repairs a memory cell of a specific bank into a redundancy memory area formed to correspond to the specific bank, when a failure occurs in the memory cell.

Suppose that a failed cell occurs in the memory bank BANK0 and is repaired and replaced with the corresponding redundancy memory area RED0. Furthermore, suppose that a failed cell does not occur in the memory bank BANK1. Here, the number of failed cells which are repairable is limited to the number of redundancy cells of the redundancy memory area RED0.

When the number of failed cells of the memory bank BANK0 exceeds the number of failed cells which are repairable, the memory apparatus cannot be used any more. That is because, although the redundancy memory area RED1 formed in the memory bank BANK1 remains in a state where it is not used, data which are to be handled in the memory bank BANK0 cannot be routed to the redundancy memory area RED1.

Furthermore, in the known semiconductor memory apparatus 10, the main page buffers PB0 and PB1 and the redundancy page buffers RPB0 and RPB1 share I/O lines connected through the input/output control circuit 130. Therefore, a data input/output operation for the redundancy memory area is performed during a separate period from a period in which a data input/output operation for the main memory area is performed. Accordingly, the time required for the data input/output operation increases. As a result, the entire operation speed of the semiconductor memory apparatus is increased.

As the semiconductor memory apparatus 10 includes the redundancy memory area, a process of determining whether an address is a repair address or not is accompanied when data is programmed into or read from the memory area 110. In general, when the repair address is determined, CAM addresses stored in a register are compared to an external address one by one. However, when the above-described method is used to determine whether an address is a repair address or not, the time required for a program/read operation increases and thus data processing speed may decrease.

SUMMARY

In an embodiment of the present invention, a semiconductor memory apparatus includes: a main memory area including a plurality of banks; one or more redundancy memory areas; and a plurality of global data lines configured to exchange data of the respective banks with the outside. One or more of the global data lines include a common global data line which is commonly used in the redundancy memory areas.

In an embodiment of the present invention, a semiconductor memory apparatus includes: a memory area including a plurality of memory banks having main memory areas configured to transmit and receive data to and from the outside through a plurality of global data lines, respectively, and one or more redundancy memory areas configured to use any one of the global data lines as a common global data line; and a controller configured to control data to be transmitted and received through the common global data line, as a redundancy program mode, a redundancy read mode, or a redundancy erase mode is enabled.

In an embodiment of the present invention, a data processing system includes: a host apparatus; and a semiconductor memory apparatus connected to the host apparatus through a host interface. The semiconductor memory apparatus includes a main memory area including a plurality of banks and one or more redundancy memory areas, and the one or more redundancy memory areas are configured to share a common global data line.

In an embodiment of the present invention, there is provided a program method of a semiconductor memory apparatus which includes a main page buffer connected to a main memory area and one or more redundancy page buffers connected to one or more redundancy memory areas and configured to share a common global data line. The program method includes the steps of: inputting data to the main page buffer, as an address signal provided to start a program operation; inputting the data of the main page buffer to a corresponding redundancy page buffer through the common global data line, when the main memory area is repaired; and programming the data of the redundancy page buffer into a corresponding redundancy memory area.

In an embodiment of the present invention, there is provided a read method of a semiconductor memory apparatus which includes a main page buffer connected to a main memory area and one or more redundancy page buffers connected to one or more redundancy memory areas and configured to share a common global data line. The read method includes the steps of: as an address signal is provided to start a read operation, outputting data of a redundancy memory area corresponding to the address signal to a redundancy page buffer; inputting the data of the redundancy page buffer to the main page buffer of the main memory area through the common global data line; and outputting the data of the main page buffer to the outside.

In an embodiment of the present invention, there is provided an erase method of a semiconductor memory apparatus which includes a main page buffer connected to a main memory area and one or more redundancy page buffers connected to one or more redundancy memory areas and configured to share a common global data line. The erase method includes the steps of: as an address signal is provided to start an erase operation, checking whether the main memory area corresponding to the address signal is repaired or not; setting the main page buffer in a program-inhibited state when the main memory area is repaired; setting a redundancy page buffer corresponding to a redundancy memory area which is not used for repair, among the redundancy memory areas, in a program-inhibited state; and applying an erase voltage.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus, an operating method thereof, and a data processing system using the same according to the present invention will be described below with reference to the accompanying drawings through exemplary embodiments.

Figure 1:
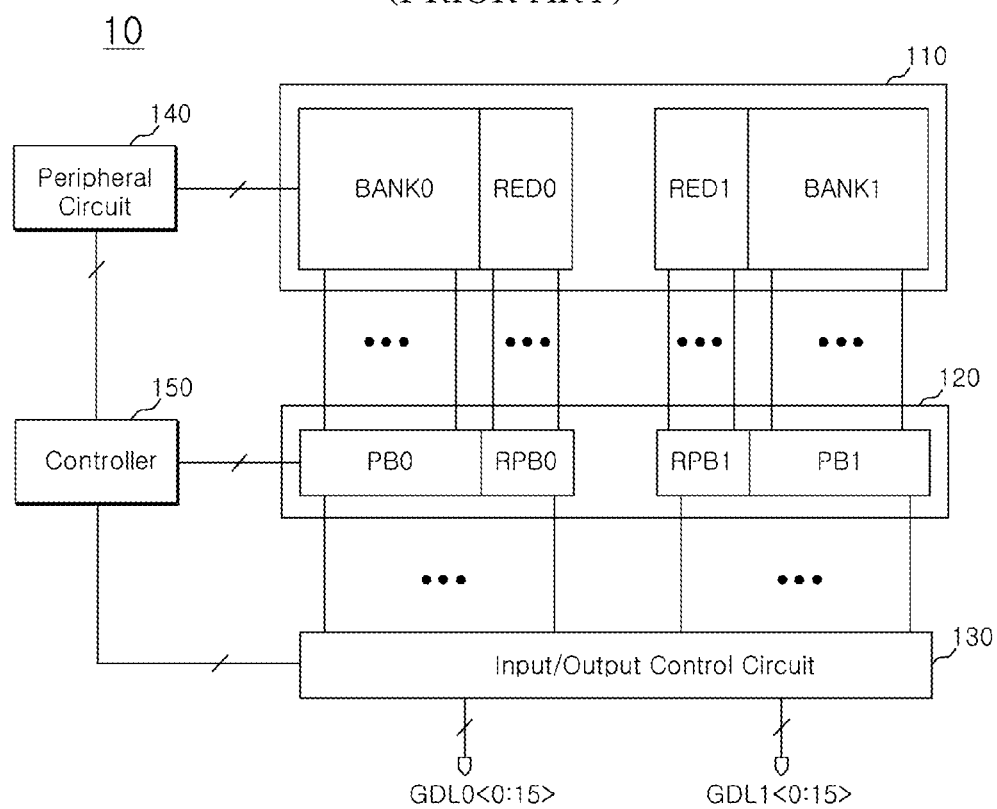
FIG. 1 is a configuration diagram of a known semiconductor memory apparatus.
Figure 2:
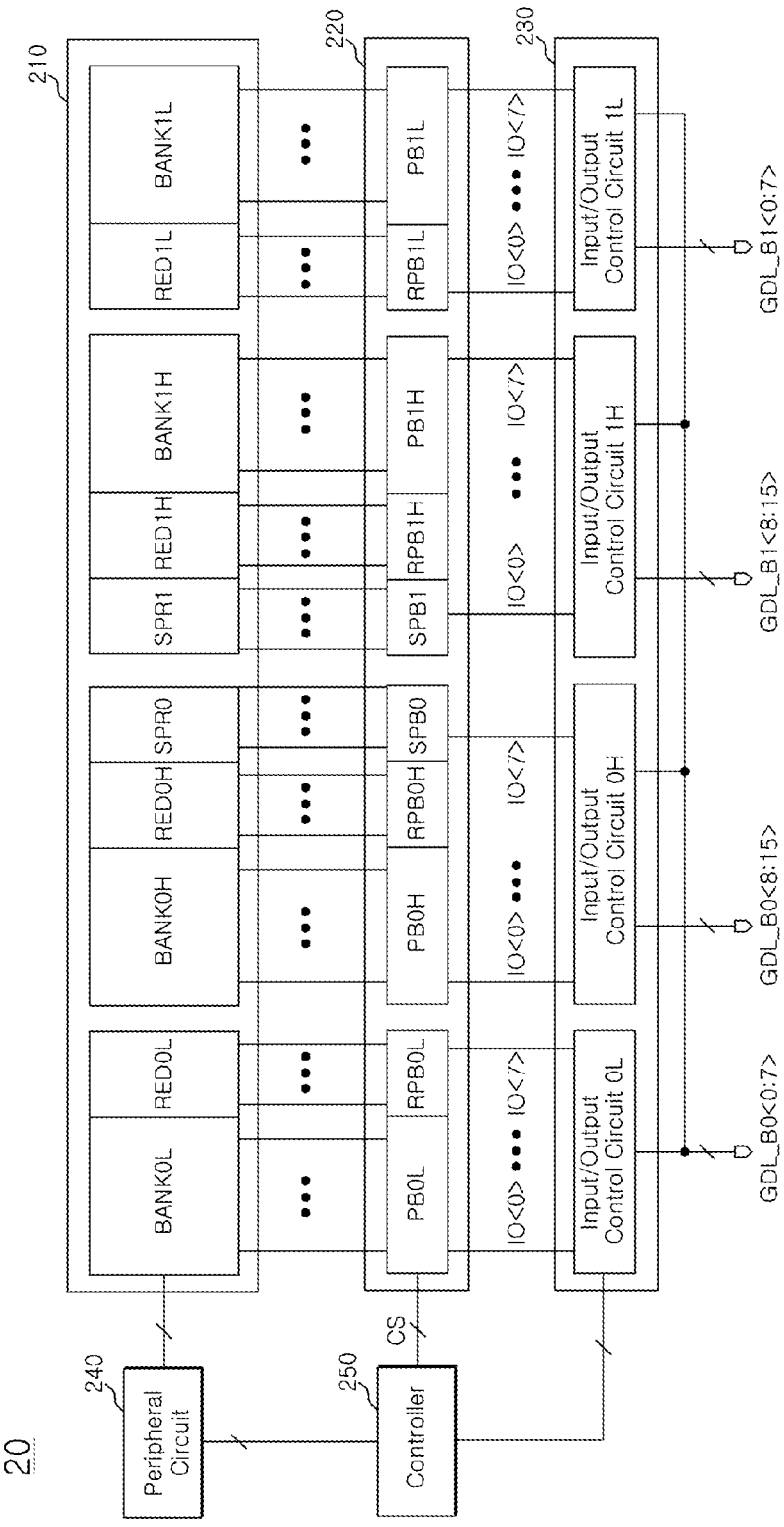
FIG. 2 is a configuration diagram of a memory apparatus according to an embodiment of the present invention.

FIG. 2 is a configuration diagram of a memory apparatus according to an embodiment of the present invention.

Referring to FIG. 2, the memory apparatus 20 according to an embodiment of the present invention includes a memory area 210, a page buffer circuit 220, an input/output control circuit 230, a peripheral circuit 240, and a controller 250. The page buffer circuit 220 may be referred to as a storage unit.

The memory area 210 includes a plurality of planes, and each of the planes may include a plurality of banks BANK0 and BANK1 serving as a main memory area, as illustrated in FIG. 2. Furthermore, the respective banks may be divided into upper banks BANK0H and BANK0H and lower banks BANK1L and BANK1L, but are not limited thereto. Each of the planes may include redundancy memory cells RED0L, RED0H, RED1L, and RED1H. Furthermore, the plane may include spare memory areas SPR0 and SPR1 for storing option information, flag information or the like.

The page buffer circuit 220 may include main page buffers as a main storage units PB0L, PB0H, PB1L, and PB1H and redundancy page buffers as a redundancy storage units RPB0L, RPB0H, RPB1L, and RPB1H. The main page buffers PB0L, PB0H, PB1L, and PB1H are configured to transmit and receive data to and from main memory cells inside the banks BANK0L, BANK0H, BANK1L, and BANK1H, and the redundancy page buffers RPB0L, RPB0H, RPB1L, and RPB1H are configured to transmit and receive data to and from redundancy memory cells inside the redundancy memory areas RED0L, RED0H, RED1L, and RED1H.

The page buffer circuit 220 is coupled to the input/output control circuit 230 through input/output lines IO, and the input/output control circuit unit 230 is configured to output data latched in the page buffer circuit 220 to the outside through global data lines GDL_B0<0:15> and GDL_B1<0:15> or configured to receive data provided from outside through the global data lines GDL and provide the received data to the page buffer circuit 220. For this operation, the input/output control circuit 230 may include input/output control circuits 0L, 0H, 1L, and 1H coupled to the respective page buffers, and the input/output control circuits 0L, 0H, 1L, and 1H are configured to transmit and receive data to and from the outside through the respective global data lines GDL_B0<0:7>, GDL_B0<8:15>, GDL_B1<0:7>, and GDL_B1<8:15>.

In an embodiment of the present invention, the global data line GDL_B0<0:7> for transmitting data to any one of the banks BANK0L, BANK0H, BANK1L, and BANK1H, for example, the bank BANK0L may be used commonly by all of the input/output control circuits 0L, 0H, 1L, and 1H.

The common global data line GDL<0:7> serves as a path for transmitting data, when data are read from the redundancy memory areas RED0L, RED0H, RED1L, and RED1H, when data are programmed into the redundancy memory areas RED0L, RED0H, RED1L, and RED1H, or when data of the redundancy memory areas RED0L, RED0H, RED1L, and RED1H are erased.

An address of the memory area, which is to be accessed during a program, read, or erase operation, for example, a bank address, a row address, or a column address is decoded by an address decoder inside the peripheral circuit 240, and the decoded address is provided to the controller 250 to check whether the decoded column address is a repair address or not. Furthermore, the controller 250 outputs a control signal CS to select a page buffer from the page buffer circuit 220 according to whether the decoded column address is a repair address or not.

During a program operation, data inputted through the common global data line GDL<0:7> may be written into designated memory cells of a selected bank among the plurality of banks BANK0L, BANK0H, BANK1L, and BANK1H. Furthermore, when a main memory cell (or column) to be accessed for the program operation is repaired, data to be written into the main memory cell is written into any one designed position among the plurality of redundancy memory areas RED0L, RED0H, RED1L, and RED1H.

In a memory apparatus in which a redundancy memory area is discriminated for each bank, a failed memory cell of a specific bank is repaired and replaced with a corresponding redundancy memory area. In an embodiment of the present invention, however, redundancy memory areas are integrated and used inside one plane. This configuration may be implemented through the common global data line GDL<0:7>, and the controller 250 generates a control signal CS to select a page buffer using an external column address, a repair address stored in a CAM, and an address of a redundancy memory area, and generates a control signal CS to select a redundancy page buffer for replacing a failed main memory cell, among a plurality of redundancy memory areas of a plane to be accessed.

In other words, when a failure occurs in a specific memory cell or column of a main memory area, the controller 250 may replace the memory cell or column having a failure with any one redundancy cell or redundancy column of all the redundancy memory areas inside the corresponding plane.

Therefore, in the semiconductor memory apparatus 20 according to an embodiment of the present invention, data to be programmed are inputted to a main page buffer during a program operation. Furthermore, the controller 250 determines whether a main memory area into which the data are to be written is repaired or not. When checking whether a repaired column exists, data inputted to a main page buffer coupled to the repaired column are transferred to a redundancy page buffer of a redundancy memory area by an address checking operation of a control logic inside or outside the controller 250 managing the redundancy operation. Here, the common global data line GDL<0:7> is used as a transmission path. Furthermore, the page buffer coupled to the repaired main memory area is set in a program-inhibited state. Then, the data temporarily-stored in the page buffer are written into the main memory area and/or redundancy memory area according to the program operation of the peripheral circuit 240.

Furthermore, such an operation may be performed before data setting is performed, during a busy period of a ready/busy (R/B) signal which is enabled as the memory apparatus enters the program operation mode. In this case, since the time required for programming data in the redundancy memory area is reduced, the memory apparatus may be operated at high speed.

During a read operation, data stored in a main memory area or redundancy memory area is outputted to a page buffer according to a decoding result of an external column address. When the main memory area to be accessed for the read operation is repaired into a redundancy memory area, data outputted from the redundancy memory area is transferred to a redundancy page buffer. In an embodiment of the present invention, since redundancy memory areas inside a plane can be used by all banks, the data outputted to the redundancy page buffer may be transferred to a corresponding main page buffer, that is, a main page buffer before repair, and then outputted.

That is, suppose that a main memory cell corresponding to a specific column address is replaced with a redundancy memory cell, and a read operation for data stored in the main memory cell is requested. In this case, when the data is outputted to a redundancy page buffer from the redundancy memory cell, the data is transferred to a main page buffer coupled to the main memory cell before replacement. The common global data line GDL<0:7> is used as a data transmission path. The data transferred to the main page buffer may be transferred to the outside through the input/output control circuit according to various read operation control signals of the peripheral circuit 240.

Such a read operation may be performed in the final period of the busy signal after the R/B signal is enabled, that is, after the data transferred to the page buffer is stabilized. As the data read operation for the redundancy memory area is performed in the final period of the busy signal, the time required for data output may be shortened.

Figure 3:
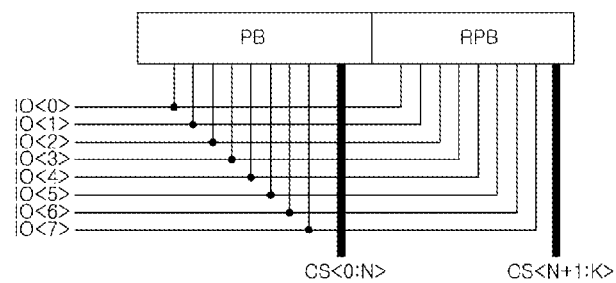
FIG. 3 is a diagram explaining a concept in which a page buffer is selected by a column select signal.

FIG. 3 is a diagram explaining a concept in which a page buffer is selected by a column select signal.

The page buffer includes a main page buffer PB coupled to a main memory area and a redundancy page buffer RPB coupled to a redundancy memory area. Data input/output lines IO<0:7> between the page buffer and the input/output control circuit are commonly used by the main page buffer PB and the redundancy page buffer RPB. Furthermore, for example, a part CS<0:N> of a column select signal CS<0:K> is used for selecting the main page buffer PB, and the other part CS<N+1:K> of the column select signal CS<0:7> is used for selecting the redundancy page buffer RPB.

The main page buffer PB and the redundancy page buffer RPB, which commonly use the input/output lines IO<0:7>, cannot input/output data of the main memory area and data of the redundancy memory area at the same time. Accordingly, the data of the redundancy memory area are inputted/outputted only during a program/read/erase period which is defined separately from a program/read/erase operation for the main memory area. Therefore, in addition to an operation time for the main memory area, an operation time for the redundancy memory area is additionally needed.

In an embodiment of the present invention, however, the redundancy memory area is controlled to be accessed in a specific period (before data setting (program), after data setting (read), and redundancy data input period (erase)) of the R/B signal which is enabled as the semiconductor memory apparatus enters the program/read/erase mode.

Furthermore, when data are inputted to and outputted from the redundancy memory area, the global data line to transmit data of any one bank among the plurality of banks is used. As a result, the redundancy memory areas provided in separate areas inside a plane may be integrated and managed so as to be commonly used by all banks inside the plane. Therefore, although the number of failed memory cells occurring in a specific bank exceeds the number of redundancy memory cells of any one redundancy memory area, the failed memory cells may be replaced with redundancy memory cells of another redundancy memory area. Accordingly, the yield of the memory apparatus may be improved.

From all these considerations, the number of redundancy memory areas may be reduced more than that in the known memory apparatus. Accordingly, the repair-related area may be reduced by 10~15%.

Figure 4:
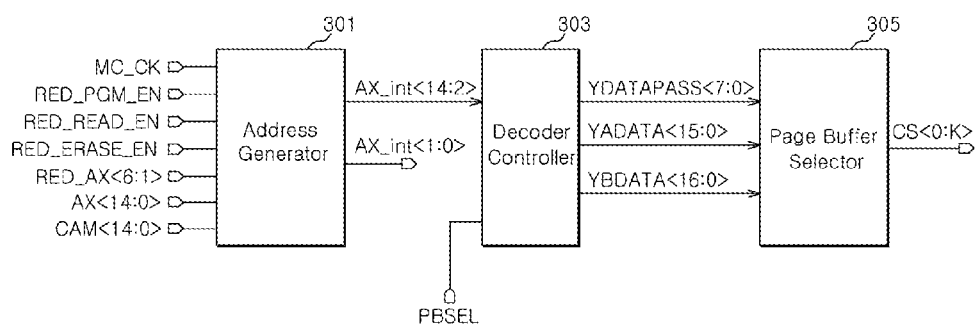
FIG. 4 is a configuration diagram of a control logic according to an embodiment of the present invention.

FIG. 4 is a configuration diagram of the control logic according to an embodiment of the present invention.

The control logic illustrated in FIG. 4 is controlled by the controller 250, and may be provided inside or outside the controller 250.

Referring to FIG. 4, the control logic 30 includes an address generator 301, a decoder controller 303, and a page buffer selector 305. The page buffer selector 305 may be referred to as a storage unit select.

The address generator 301 is configured to generate an internal address according to whether a main memory cell is repaired or not, during a redundancy program operation, a redundancy read operation, or a redundancy erase operation.

More specifically, the address generator 301 uses a control clock signal MC_CK as a main clock signal. Furthermore, the address generator 301 is enabled by any one of a redundancy program enable signal RED_PGM_EN, a redundancy read enable signal RED_READ_EN, and a redundancy erase enable signal RED_ERASE_EN, and outputs internal column addresses AX_int<14:2> and AX_int<1:2> according to a redundancy area address READ_AX<6:1>, an external column address AX<14:0>, and a repair CAM address CAM<14:0>.

In a semiconductor memory which stores and manages repair addresses using a CAM, repair-related information may be stored in a register (not illustrated) of the controller 250. The register may store a flag data indicating whether each column of a main memory area is repaired or not and an address of a failed column. Furthermore, in the case of a repaired column, a repair CAM address for replacing the repaired column is stored in a CAM cell which is separately provided. The CAM cell may be used by designating a part of the main memory area or the redundancy memory area as CAM cells. Alternatively, a CAM area may be provided separately from the main and redundancy memory areas.

The redundancy area address RED_AX<6:1> provided to the address generator 301 of FIG. 4 may include flag information referred to by the register according to a column address of the main memory area accessed for a program/read/erase operation. Therefore, the address generator 301 reads a repair CAM address CAM<14:0> from the CAM cell to route an access path, only when a flag data of the access-target column address is activated. That is, in an embodiment of the present invention, all CAM cells are not scanned, but a repair CAM address CAM<14:0> may be read only for a column address where a repair operation is performed, using the redundancy area address RED_AX<6:1>. For this operation, the redundancy area address REA_AX<6:1> may be configured to sequentially toggle according to the control clock signal MC_CK. Since all CAM cells are not scanned, the time required for determining a repair address may be reduced.

That is, the address generator 301 generates an internal CAM address (refer to AX_CAM<14:0>) of an area corresponding to the redundancy area address RED_AX<6:1>, according to the redundancy operation mode. Furthermore, the address generator 301 outputs the internal column addresses AX_int<14:2> and AX_int<1:0> in response to the internal CAM address, an external column address AX<14:0>, and the redundancy area address RED_AX<6:1>.

Referring to FIG. 4, the decoder controller 303 is configured to generate column data signals YADATAPSS<7:0>, YADATA<15:0>, and YBDATA<16:0> in response to the internal column addresses AX_int<14:2> and AX_int<1:0> outputted from the address generator 301 and a page buffer select signal PBSEL. Furthermore, the page buffer selector 305 is configured to generate the column select signal CS<0:K> using the column data signals YADATAPSS<7:0>, YADATA<15:0>, and YBDATA<16:0>. The page buffer select signal PBSEL May be referred to as a storage unit select signal.

The column select signal CS<0:K> outputted from the page buffer selector 305 are used for enabling the main page buffer PB or the redundancy page buffer RPB as illustrated in FIG. 3.

Figure 5:
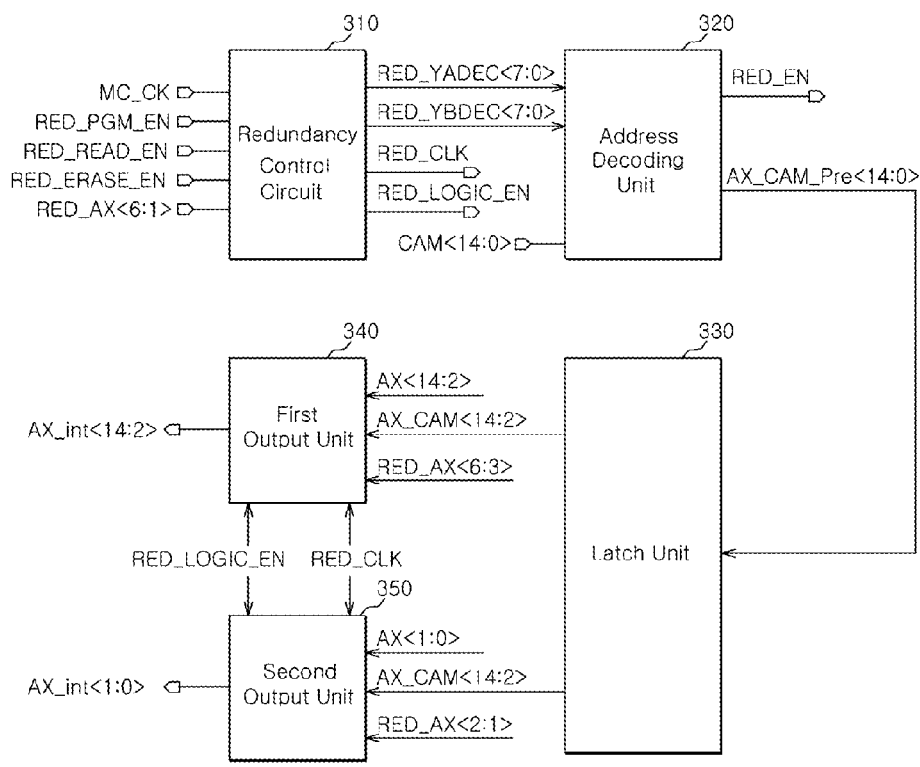
FIG. 5 is a configuration diagram of an address generator illustrated in FIG. 4.

FIG. 5 is a configuration diagram of the address generator illustrated in FIG. 4.

Referring to FIG. 5, the address generator 301 may include a redundancy control circuit 310, an address decoding unit 320, a latch unit 330, a first output unit 340, and a second output unit 350.

First, the redundancy control circuit 310 operates in response to the control clock signal MC_CK. Furthermore, as any one of the redundancy program enable signal RED_PGM_EN, the redundancy read enable signal RED_READ_EN, and the redundancy erase enable signal RED_ERASE_EN is enabled, the redundancy control circuit 310 outputs redundancy column addresses RED_YADEC<7:0> and RED_YBDEC<7:0>, a redundancy clock signal RED_CLK, and a redundancy logic enable signal RED_LOGIC_EN in response to the redundancy area address RED_AX<6:1>.

Here, the redundancy area address RED_AX<6:1> is a flag data indicating whether a column address provided together with a program/read/erase command is repaired or not, and provided from a register storing redundancy-related information. In other words, the redundancy area address RED_AX<6:1> is a flag data indicating whether each column address to be accessed is repaired or not. Furthermore, the redundancy area address RED_AX<6:1> is configured to sequentially toggle according to the control clock signal MC_CK, and the redundancy column addresses RED_YADEC<7:0> and RED_YBDEC<7:0> generated from the redundancy area address REA_AX<6:1> have a designated logic level according to whether a corresponding redundancy area is repaired or not.

The redundancy clock signal RED_CLK may be generated by delaying the control clock signal MC_CK by a certain time, and the redundancy logic enable signal RED_LOGIC_EN is enabled as any one of the redundancy program enable signal RED_PGM_EN, the redundancy read enable signal RED_READ_EN, and the redundancy erase enable signal RED_ERASE_EN is enabled, and maintains the enabled state until the corresponding operation is ended.

The address decoding unit 320 is configured to generate a redundancy enable signal RED_EN and an internal CAM pre-address AX_CAM_pre<14:0> in response to the redundancy column addresses RED_YADEC<7:0> and RED_YBDEC<7:0> and the repair CAM address CAM<14:0> provided from a CAM latch, and the latch unit 330 is configured to latch the internal CAM pre-address AX_CAM_pre<14:0> to output as the internal CAM address AX_CAM<14:0>.

The first output unit 340 is configured to output a first internal column address AX_int<14:2> in response to a part AX_CAM<14:2> of the internal CAM address, a part AX<14:2> of the external column address, and a part RED_AX<6:3> of the redundancy area address. The second output unit 250 is configured to generate a second internal column address AX_int<1:0> in response to a part AX_CAM<1:0> of the internal CAM address, a part AX<1:0> of the external column address and a part RED_AX<2:1> of the redundancy area address.

Here, a part AX_CAM<1:0> of the internal CAM address, a part AX<1:0> of the external column address and a part RED_AX<2:1> of the redundancy area address are used for designating any one of the plurality of banks or any one of the plurality of redundancy memory areas. Furthermore, the part AX_CAM<14:2> of the internal CAM address, the part AX<14:2> of the external column address, and the part RED_AX<6:3> of the redundancy area address are used for designating an access-target column inside a selected bank or a redundancy memory area.

As such, when generating the internal column address AX_int<14:0>, the address generator 301 sequentially outputs the internal CAM address CAM_AX<14:0> whenever the redundancy area address RED_AX<6:1> toggles. Furthermore, the address generation unit 301 compares the internal cam addresses CAM_AX<14:0>, the external column addresses AX<14:0>, and the redundancy area addresses RED_AX<6:1>, and generates the internal column addresses AX_int<14:0> which is to be accessed. Accordingly, the internal column address AX_int<14:0> outputted from the address generator 301 may include a column address inside a bank to be accessed or a redundancy memory area and the corresponding bank or a redundancy memory area.

Figure 6:
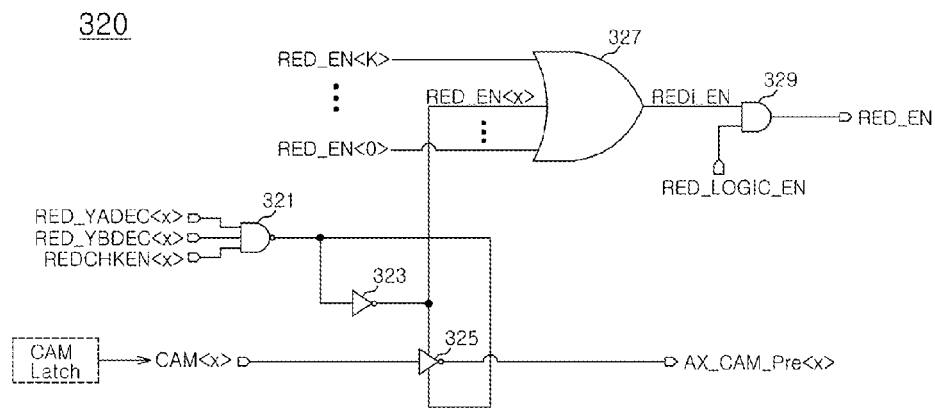
FIG. 6 is a configuration diagram of an address decoding unit illustrated in FIG. 5.

FIG. 6 is a configuration diagram of the address decoding unit illustrated in FIG. 5.

Referring to FIG. 6, the address decoding unit 320 may include a driving signal generation section 321 and 323, an internal CAM address output section 325, a redundancy determination section 327, and a redundancy mode enable section 329.

The driving signal generation section 321 and 323 is configured to generate a CAM output driving signal RED_EN<K:0> in response to the redundancy column addresses RED_YADEC<7:0> and RED_YBDEC<7:0> and a redundancy check enable signal REDCHKEN. Here, the redundancy check enable signal REDCHKEN has a designated logic level according to whether a CAM latch accessed to acquire an internal CAM address is used or not. Furthermore, the redundancy column addresses RED_YADEC<7:0> and RED_YBDEC<7:0> are generated as the redundancy area address RED_AX<6:1> sequentially toggles according to the control clock signal MC_CK.

The internal CAM address output section 325 is driven according to the CAM output driving signal RED_EN<K:0> and outputs the repair CAM address CAM<14:0> as an internal CAM pre-address AX_CAM_pre<14:0>. When the CAM output driving signal RED_EN<K:0> is disabled, the internal CAM address output section 325 is disabled. For example, only when the CAM output driving signal RED_EN<K:0> is enabled, the internal CAM address output section 325 is driven to output the internal CAM pre-address AX_CAM_pre<14:0>.

The redundancy determination section 327 is configured to generate a redundancy internal enable signal RED_iEN in response to the CAM output driving signal RED_EN<K:0>.

The redundancy mode enable section 329 is configured to generate a redundancy enable signal RED_EN for announcing the redundancy operation mode, in response to the redundancy internal enable signal RED_iEN and the redundancy logic enable signal RED_LOGIC_EN.

As illustrated in FIG. 6, the address decoding unit 320 according to an embodiment of the present invention generates the redundancy column addresses RED_YADEC<7:0> and RED_YBDEC<7:0> according to a flag signal indicating whether a column address to be accessed for an operation of the semiconductor memory apparatus is repaired or not. Furthermore, the CAM latch having redundancy column address information on the column address to be accessed outputs the repair CAM addresses CAM<14:0> as the internal CAM pre-address AX_CAM_pre<14:0>.

Therefore, for example, only a redundancy column address corresponding to the repaired column address may be checked, without scanning all redundancy column addresses. Accordingly, information on the internal CAM address AX_CAM<14:0> for changing the access path may be acquired at high speed.

Figure 7:
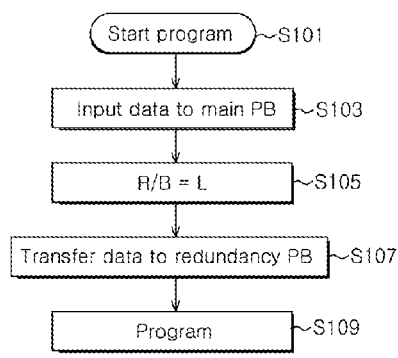
FIGS. 7 and 8 are flow charts explaining a program method according to an embodiment of the present invention.
Figure 8:
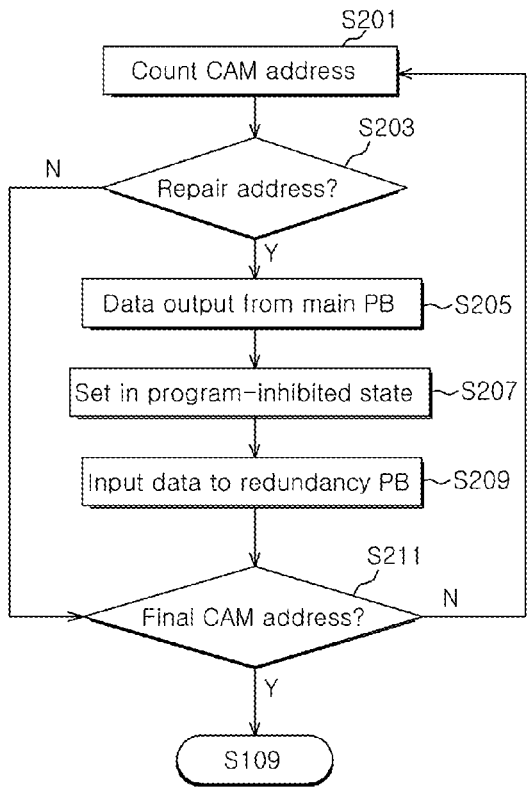

FIGS. 7 and 8 are flow charts explaining a program method according to an embodiment of the present invention.

As a program command is inputted so as to start a program operation at step S101, all data are inputted to a main page buffer at step S103.

Furthermore, as the R/B signal is enabled to a low level at step S105, a redundancy program operation is performed. That is, when a main memory area accessed for a program operation is repaired and replaced with a redundancy memory area, the data latched in the main page buffer is transferred to a redundancy page buffer through the common global data line at step S107. Furthermore, the transferred data are programmed into a redundancy memory area coupled to the redundancy page buffer at step S109.

The redundancy program operation may be performed before a data setting process is performed after the R/B signal is enabled to a low level, that is, before a program operation for the main memory area. Therefore, since a separate period for programming the redundancy memory area does not need to be separately defined, the data may be programmed at high speed.

The redundancy program mode is performed as the redundancy program enable signal RED_PGM_EN is enabled. The step S107 of transmitting the data of the main page buffer to the redundancy page buffer is performed through the common global line.

FIG. 8 is a flow chart explaining the step S107 of transmitting the data to the redundancy page buffer in FIG. 7.

First, a CAM address is counted at step S201, and whether a column address accessed for a program operation is a repaired column address or not is checked at step S203. Depending on whether the column address is a repaired column or not, the internal column address AX_int<14:0> is outputted.

In an embodiment of the present invention, the steps S201 and S203 of counting the CAM address and checking whether the column address is a repaired column address or not may be performed by the control logic of FIGS. 4 to 6. That is, the driving signal generation section 321 and 323 of the address decoding unit 320 outputs the internal CAM address AX_CAM<14:0> as the redundancy area address RED_AX<6:1> toggles in response to the control clock signal MC_CK, and outputs the internal column address AX_int<14:2> and AX_int<1:0> according to the redundancy area address RED_AX<6:1>, the external column address AX<14:0>, and the repair CAM address CAM<14:0>.

At step S203, if the column address is a repaired column address and the internal column address AX_int<14:0> corresponding to the column address is acquired, the data are outputted from the main page buffer at step S205. Then, the controller 205 sets the main page buffer having outputted the data in a program-inhibited state at step S207.

The data outputted from the main page buffer are transmitted to a corresponding redundancy page buffer at step S209.

Such an operation is repeated until the final CAM address is counted as the redundancy area address RED_AX<6:1> toggles, at step S211. Through the operation, when the column address of the main memory area to be accessed is repaired, data inputted to the main page buffer of the corresponding column may be transferred to the redundancy page buffer.

Figure 9:
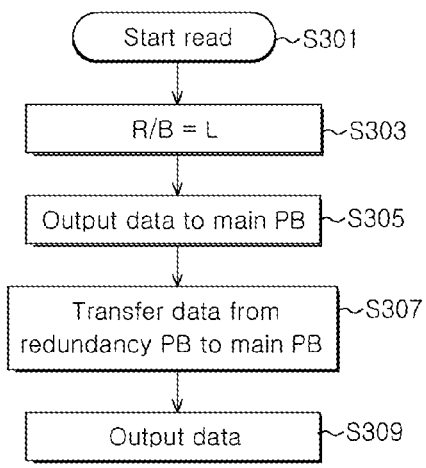
FIGS. 9 and 10 are flow charts explaining a read method according to an embodiment of the present invention.
Figure 10:
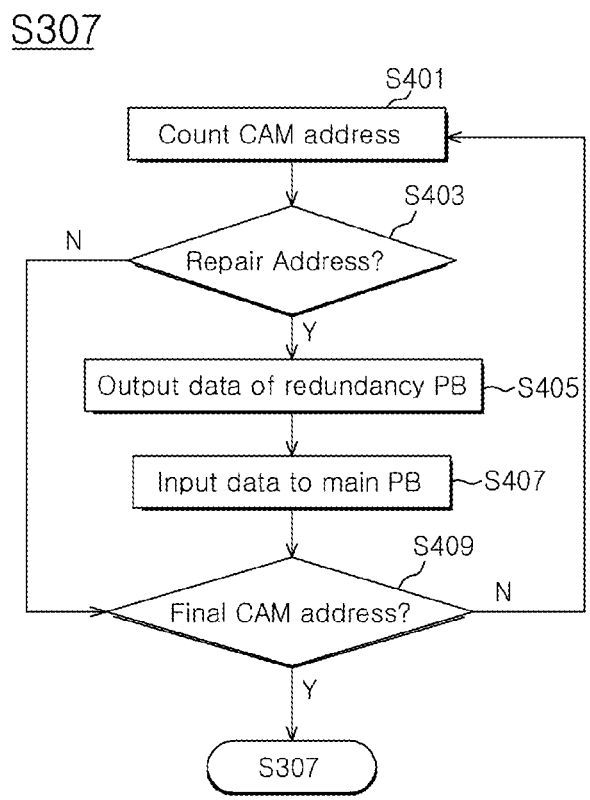

FIGS. 9 and 10 are flow charts explaining a read method according to an embodiment of the present invention.

As a read command is inputted to start a read operation at step S301, the R/B signal is enabled to a low level at step S303. After the R/B signal is enabled to a low level, data of a main memory area is transferred to a main page buffer by a read operation for the main memory area. When entering a final period of the R/B signal, that is, a period after the data transferred to the main page buffer is stabilized, a redundancy read mode is enabled to output data to a redundancy page buffer at step S305.

The data outputted to the redundancy page buffer is transferred through the common global data line to the main page buffer coupled to the main memory area before repair, at step S307. Then, the data transferred to the main page buffer is transferred to an input/output control circuit through an input/output line at step S309.

Even in the redundancy read mode, the data of the redundancy page buffer may be transferred to the main page buffer through the common global line. FIG. 10 shows the process in detail.

First, a CAM address is counted at step S401, and whether a column address to be accessed for a read operation is a repaired column address or not is checked at step S403. Depending on whether the column address is a repaired column address or not, whether the internal column address AX_int<14:0> is outputted or not is determined.

In an embodiment of the present invention, the steps S401 and S403 of counting the CAM address and checking whether the column address is a repaired column address or not may be performed by the control logic of FIGS. 4 to 6. That is, the driving signal generation section 321 and 323 of the address decoding unit 320 outputs the internal column address AX_int<14:0> as the redundancy area address RED_AX<6:1> toggles in response to the control clock signal MC_CK, and outputs the internal column address AX_int<14:2> and AX_int<1:0> according to the redundancy area address RED_AX<6:1>, the external column address AX<14:0>, and the repair CAM address CAM<14:0>.

At the step S403, if the column address is a repaired column address and the internal column address AX_int<14:0> corresponding to the column address is acquired, the data is outputted from the redundancy page buffer at step S405. Furthermore, the controller 250 transmits the data to a main page buffer of a main memory area replaced with the redundancy memory area using the redundancy page buffer having outputted the data, at step S407.

Such an operation is repeated until the final CAM address is counted as the redundancy area address RED_AX<6:1> toggles, at step S409. Through the operation, when the column address of the main memory address to be accessed is a repaired column address, the data of the redundancy page buffer may be outputted through the main page buffer.

Figure 11:
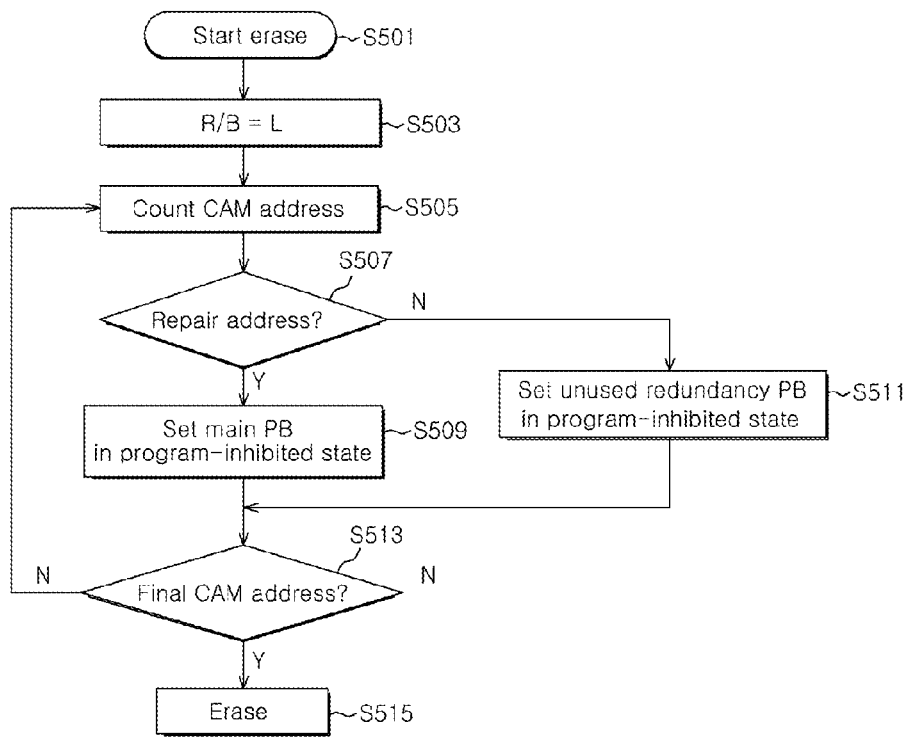
FIG. 11 is a flow chart through explaining an erase method according to an embodiment of the present invention.

FIG. 11 is a flow chart through explaining an erase method according to an embodiment of the present invention.

During an erase mode, a page buffer of a repaired main memory area and a page buffer of a redundancy memory area which is not used for a repair operation are set in a program-inhibited state, and an erase operation is performed, for example, only for the other page buffers. That is, since the data level of the repaired main memory area or the redundancy memory area which is not used for the repair operation may be ignored, an unnecessary erase operation may be minimized.

More specifically, as the redundancy erase enable signal RED_ERASE_EN is enabled at step S501 and the R/B signal is enabled to a low level at step S503, the CAM address is counted to check whether an address accessed for an erase operation is a repaired address or not at steps S505 and S507.

The steps S505 and S507 of counting the CAM address and checking whether the address accessed for the erase operation is a repaired address or not may be performed by the control logic of FIGS. 4 to 6. Since the steps are similar to those of the above-described program and read operations, the detailed descriptions are omitted herein.

At the step S507, if the address accessed for the erase operation is a repaired address, a page buffer of a corresponding memory area is set in a program-inhibited state at step S509. Furthermore, when the address accessed for the erase operation is not a repaired address, a page buffer of a corresponding redundancy memory area is set in a program-inhibited state at step S511.

Such an operation is repeated until the final CAM address is counted as the redundancy area address RED_AX<6:1> toggles, at step S513. After both of the main page buffer used for a repair operation and the redundancy page buffer which is not used for a repair operation are set in a program-inhibited state, the erase operation is performed at step S515.

Figure 12:
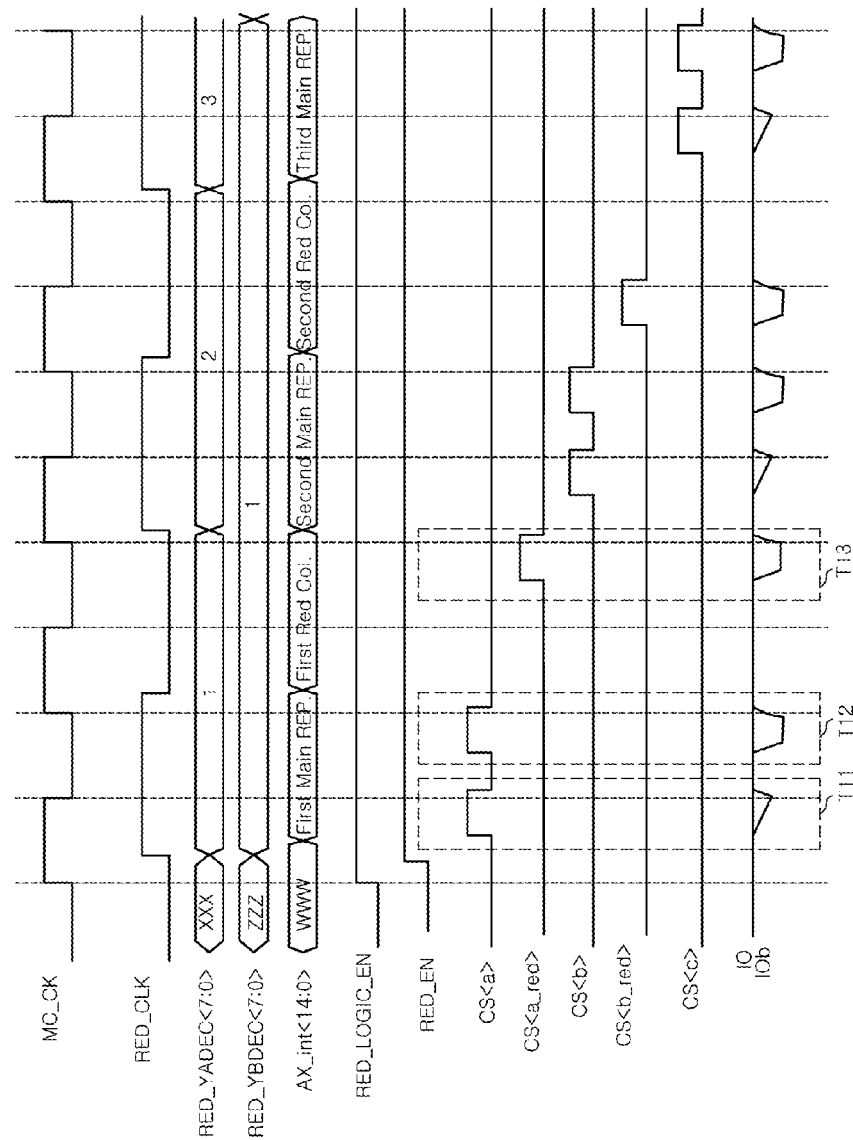
FIG. 12 is a timing diagram explaining the program method according to an embodiment of the present invention.

FIG. 12 is a timing diagram explaining the program method according to an embodiment of the present invention. Here, suppose that a redundancy program operation is performed before data setting is performed after the R/B signal is enabled to a low level.

During a redundancy program operation, the redundancy area address RED_AX<6:1> toggles according to the control clock signal MC_CK, and the redundancy column addresses RED_YADEC<7:0> and RED_YBDEC<7:0> are generated from the redundancy area address RED_AX<6:1>. As a result, the internal column address AX_int<14:0> is also outputted according to the redundancy area address RED_AX<6:1>.

During a first cycle of the control clock signal MC_CK, data of the main page buffer is outputted (T11), and the main page buffer is set in a program-inhibited state (T12). Furthermore, after a repair CAM address is checked by the control logic, the data outputted from the main page buffer is inputted to a corresponding redundancy page buffer during a second cycle of the control clock signal MC_CK (T13).

Such an operation may be sequentially performed for the entire internal column addresses AX_int<14:0>.

One cycle of the control clock signal MC_CK is 50 ns. During two cycles of the control clock signal MC_CK, an operation of transferring the data of the main page buffer to the redundancy page buffer is performed. When supposing that a program operation is performed for 64 columns, a time of 6.4 μs (=64*2*50 ns) is required for a redundancy program operation. Therefore, before data setting is completed after the R/B signal is enabled to a low level, the redundancy program operation may be sufficiently performed.

Figure 13:
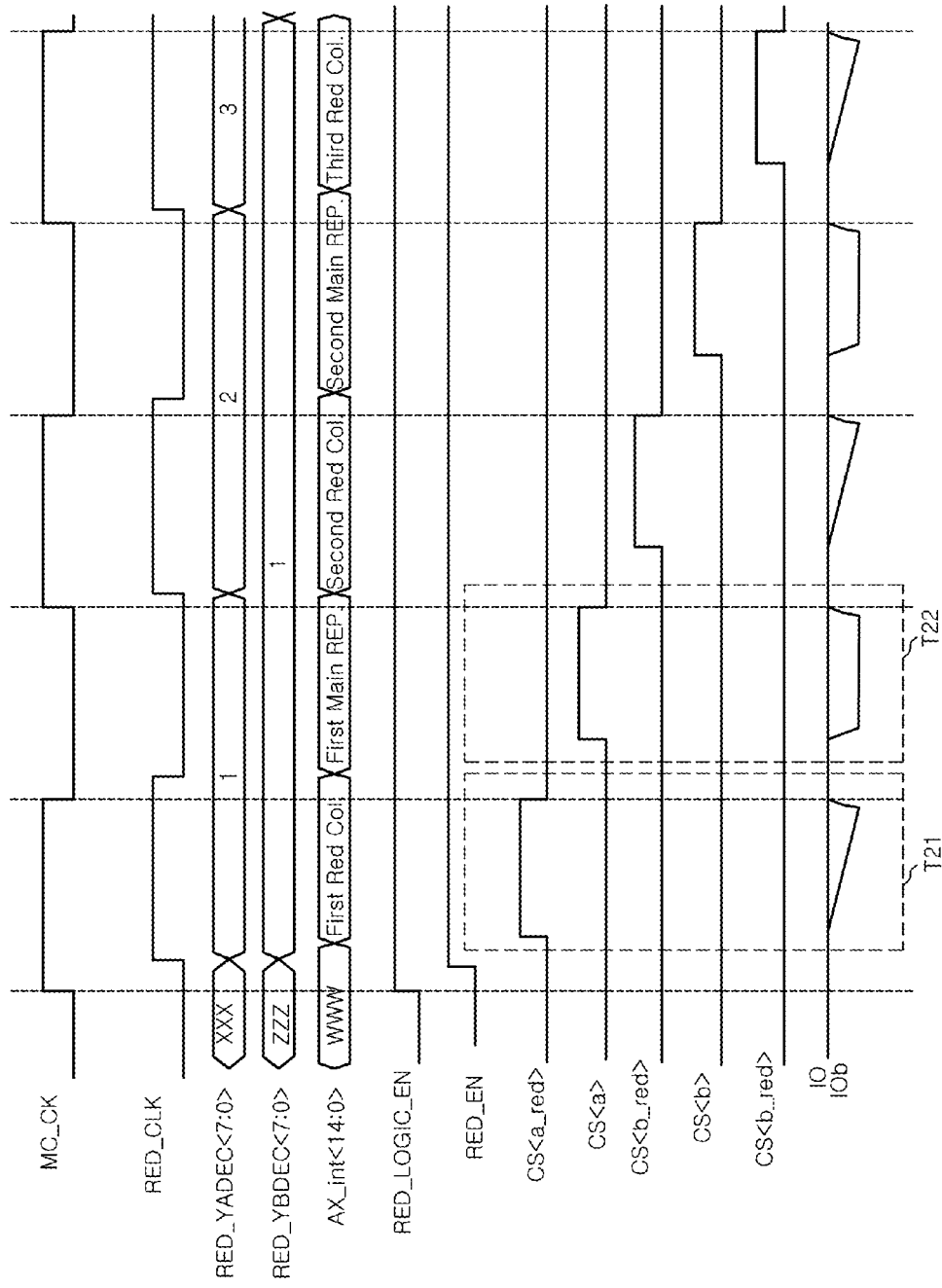
FIG. 13 is a timing diagram explaining the read method according to an embodiment of the present invention.

FIG. 13 is a timing diagram explaining the read method according to an embodiment of the present invention. Here, suppose that a redundancy read operation is performed in a final period before the R/B signal is disabled to a high level after being enabled to a low level, that is, in a period after data transferred to a page buffer is stabilized.

During a rising period of the control clock signal MC_CK, data of a redundancy memory area accessed for a read operation is outputted to a redundancy page buffer (T21). Furthermore, during a falling period of the control clock signal MC_CK, the data of the redundancy page buffer is transferred to a corresponding main page buffer (T22).

When supposing that one cycle of the control clock signal MC_CK is 50 ns and a read operation is performed for 64 columns, a time of 3.2 μs (=64*50 ns) is required for a redundancy read operation. Therefore, the redundancy read operation may be sufficiently performed in the final period before the R/B signal is disabled.

Figure 14:
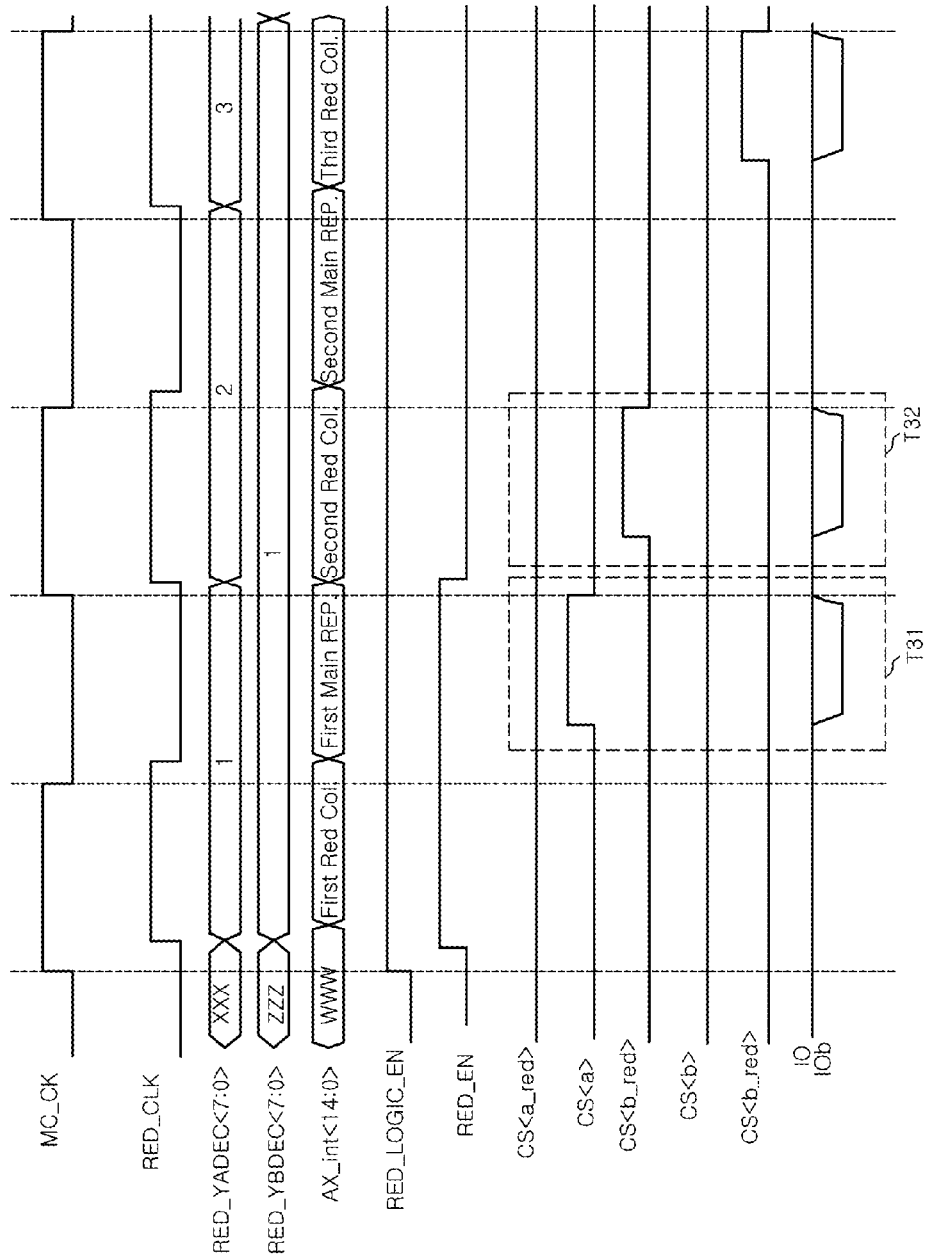
FIG. 14 is a timing diagram explaining the erase method according to an embodiment of the present invention.

FIG. 14 is a timing diagram explaining the erase method according to an embodiment of the present invention.

In an embodiment of the present invention, a redundancy erase operation is performed after a main page buffer used for a repair operation and a redundancy page buffer which is not used for the repair operation are set in a program-inhibited state.

For this operation, addresses of a repaired main memory area and a redundancy memory area which is not used are acquired, and a main page buffer used for the repair operation is set in a program-inhibited state during a falling period of the control clock signal MC_CK (T31). Furthermore, the redundancy page buffer which is not used is set in a program-inhibited state during a rising period of the control clock signal MC_CK (T32).

Accordingly, an unnecessary erase operation on a memory cell may be minimized. Therefore, the time required for the erase operation may be shortened, and the lifetime of redundancy memory cells which are not used may be extended.

Figure 15:
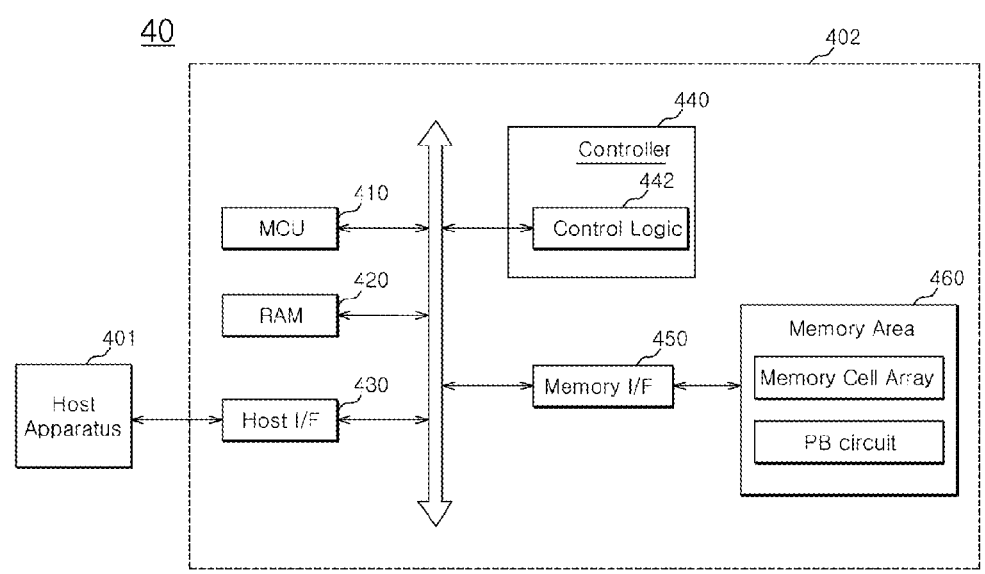
FIG. 15 is a configuration diagram of a data processing system according to an embodiment of the present invention.

FIG. 15 is a configuration diagram of a data processing system according to an embodiment of the present invention.

Referring to FIG. 15, the data processing system 40 according to an embodiment of the present invention includes a host apparatus 410 and a semiconductor memory apparatus 402. Furthermore, the semiconductor memory apparatus 402 may include a micro controller unit (MCU) 410, a working memory (RAM) 420, a host interface 430, a controller 440, a memory interface 450, and a memory area 460.

The MCU 410 is configured to control overall operations of the semiconductor memory apparatus 402, and firmware or applications for the MCU 410 may be loaded into the RAM 420 and then executed.

The RAM 420 is configured to temporarily store data required for the operation of the MCU 410. According to the control of the MCU 410, the RAM 420 may temporarily store data of the memory area 460 and then provide the stored data to the host apparatus 401 or temporarily store data of the host apparatus 410 and then provide the stored data to the memory area 460.

The host interface 430 is configured to control data exchange between the host apparatus 401 and the memory area 460, and provide a protocol conversion function, if necessary.

The controller 440 is coupled to the memory area 460 through the memory interface 450 and configured to provide commands, addresses, control signals, and data for controlling the operation of the memory area 460. In particular, the controller 440 according to an embodiment of the present invention includes a control logic 442 to manage redundancy-related operations for the memory area 460. The control logic 442 may be configured as described with reference to FIGS. 4 to 6, for example.

The memory area 460 includes a memory cell array and a page buffer circuit. The memory cell array forming the memory area 460 may include a plurality of semiconductor memory cells, and may be configured to have one or more planes each including a plurality of banks or one or more chips. In particular, as illustrated in FIG. 2, the memory area 460 may be configured to include a plurality of banks and one or more redundancy memory areas, and designed to have a structure in which any one global data line is commonly used by one or more redundancy memory areas among the plurality of banks.

The configuration of the semiconductor memory apparatus 402 is not limited thereto, but additional devices or components may be added depending on the environment of a system which is to be applied. For example, the semiconductor memory apparatus 402 may further include a ROM for storing data required for an initial booting operation, an error correction unit, a power supply unit, a communication module and the like.

The semiconductor memory apparatus 402 may be packaged into a memory card. Furthermore, the data processing system 40 may further include a separate application chipset such as a camera module, in addition to the host apparatus 401.

The control logic 442 inside the controller 250, which is charge of the redundancy operation, controls a redundancy program/read/erase operation to be performed during a designated portion of a low period of the R/B signal. Furthermore, as the banks and the redundancy memory areas of the memory area 460 are designed to use the common global data line, the data of a redundancy memory area are controlled to be handled through a main page buffer before being repaired.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
   a memory area comprising a plurality of memory banks having main memory areas configured to transmit and receive data to and from the outside through a plurality of global data lines, respectively, and one or more redundancy memory areas configured to transmit and receive data to and from the outside through a common global data line which is any one of the plurality of global data lines; and
   a controller configured to be electrically connected with the memory area, and configured to control data to be transmitted and received through the common global data line, as a redundancy program mode, a redundancy read mode, or a redundancy erase mode is enabled;
   wherein, as the redundancy program mode, the redundancy read mode, or the redundancy erase mode is enabled, the controller checks whether a column address of a memory bank to be accessed is repaired or not, and generates an internal column address and a column select signal, and the memory area further comprises main storage units coupled to the respective main memory areas and redundancy storage units coupled to the respective redundancy memory areas, and the controller comprises:

an address generator configured to generate the internal column address according to whether the column address is repaired or not; and a storage unit selector configured to generate the column select signal in response to the internal column address and a storage unit select signal.

2. The semiconductor memory apparatus according to claim 1, wherein each of the main storage units or each of the redundancy storage units is enabled by the column select signal.

3. The semiconductor memory apparatus according to claim 1, further comprising:

a register configured to store repair-related information; and a code addressable memory (CAM) latch configured to store a repair CAM address, wherein the address generator comprises:

an address decoding unit configured to generate the repair CAM address as an internal CAM address in response to a flag signal indicating whether the column address is repaired or not; and an output unit configured to generate the internal column address in response to the flag signal, the internal CAM address, and the column address of the memory bank to be accessed.

4. The semiconductor memory apparatus according to claim 3, wherein the address generator outputs the internal column address in response to a control clock signal which is outputted as the redundancy program mode, the redundancy read mode, or the redundancy erase mode is enabled.

* * * * *